(12) United States Patent
Aoki (10) Patent No.: US 8,803,329 B2
(45) Date of Patent: Aug. 12, 2014

(54) SEMICONDUCTOR PACKAGE AND STACKED SEMICONDUCTOR PACKAGE (71) Applicant: Canon Kabushiki Kaisha, Tokyo (JP)

(72) Inventor: Takashi Aoki, Urayasu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/892,538

(22) Filed: May 13, 2013

(65) Prior Publication Data

US 2013/0320568 A1    Dec. 5, 2013

(30) Foreign Application Priority Data

May 30, 2012 (JP) ................................. 2012-122975

(51) Int. Cl.
    *H01L 23/495* (2006.01)
(52) U.S. Cl.
    USPC ........................................ 257/774; 257/686
(58) Field of Classification Search
    USPC .................. 257/664, 723, 777, 686; 361/774; 174/261
    See application file for complete search history.

(56) References Cited

U.S. PATENT DOCUMENTS

| 6,825,544 | B1 * | 11/2004 | Jin ................................. 257/499 |
| 6,919,227 | B2 * | 7/2005 | Nishiyama ..................... 438/109 |
| 7,391,113 | B2 * | 6/2008 | Isa et al. ......................... 257/737 |
| 7,535,113 | B2 * | 5/2009 | Kramer .......................... 257/784 |
| 7,720,119 | B2 | 5/2010 | Aoki |
| 7,884,451 | B2 * | 2/2011 | Sutardja ......................... 257/666 |

FOREIGN PATENT DOCUMENTS

JP    2011-014757    1/2011

* cited by examiner

*Primary Examiner* — Roy Potter
(74) *Attorney, Agent, or Firm* — Fitzpatrick, Cella, Harper & Scinto (57) ABSTRACT

A semiconductor package includes a printed wiring board and a semiconductor chip that has a first signal terminal and a second signal terminal and is mounted on the printed wiring board. The printed wiring board has a first land and a second land for solder joining, which are formed on a surface layer thereof. Further, the printed wiring board has a first wiring for electrically connecting the first signal terminal of the semiconductor chip and the first land, and a second wiring for electrically connecting the second signal terminal of the semiconductor chip and the second land. The second wiring is formed so that the wiring length thereof is larger than that of the first wiring. The second land is formed so that the surface area thereof is larger than that of the first land. This reduces difference in transmission line characteristics due to the difference in wiring length.

17 Claims, 5 Drawing Sheets

SEMICONDUCTOR PACKAGE AND STACKED SEMICONDUCTOR PACKAGE

BACKGROUND OF THE INVENTION

1. Field of the Invention

The present invention relates to a semiconductor package that includes a printed wiring board having a semiconductor element mounted thereon, and to a stacked semiconductor package having a package on package (PoP) structure.

2. Description of the Related Art

As one form of a semiconductor package, a stacked semiconductor package having a PoP structure is known (see Japanese Patent Application Laid-Open No. 2011-14757). This is a structure in which an upper semiconductor package (for example, a package having a DDR memory mounted thereon) is stacked on a lower semiconductor package (for example, a package having a system LSI mounted thereon).

The upper semiconductor package includes an upper semiconductor chip as a semiconductor element, and an upper printed wiring board having the upper semiconductor chip mounted thereon. The lower semiconductor package includes a lower semiconductor chip as a semiconductor element, and a lower printed wiring board having the lower semiconductor chip mounted thereon. Communication between the lower semiconductor chip and the upper semiconductor chip is made through transmission lines formed by solder joining lands of the lower printed wiring board and lands of the upper printed wiring board.

Generally, communication between semiconductor chips requires multiple transmission lines. As an example, when 8-bit communication is made between a system LSI and a DDR memory, eight bus wirings DQ[0] to DQ[7] for transmitting data signals and two differential signal wirings DQS and /DQS for transmitting strobe signals are necessary. In recent years, the system is more sophisticated in functionality, and the number of the transmission lines used for communication between the upper and lower semiconductor chips is far above 100.

Communication signals between semiconductor elements are required to be synchronized with each other to some extent so that malfunction does not occur. In order to ensure the synchronization, bus circuits or differential circuits provided in a semiconductor element are formed so as to have the same circuit characteristics. In addition, the bus wirings or the differential signal wirings as the transmission lines are required to have the same transmission line characteristics. In recent years, as the system becomes more sophisticated in functionality, signal speed is enhanced, and allowable synchronization becomes stricter.

However, the length of a wiring that extends from a signal terminal of the semiconductor element to a land varies depending on the position of the land, and thus, the length of the wiring varies, and, due to difference in parasitic inductance caused thereby, the transmission line characteristics vary. If the transmission line characteristics vary among wirings, in a semiconductor element on a signal receiving side, the waveform varies among multiple signals, and thus, it is difficult to ensure synchronization of the signals.

SUMMARY OF THE INVENTION

Accordingly, an object of the present invention is to reduce difference in transmission line characteristics due to difference in wiring length.

According to one aspect of the present invention, there is provided a stacked semiconductor package, including: a first semiconductor package including: a first semiconductor element having a first signal terminal and a second signal terminal; and a first wiring board having the first semiconductor element mounted on one surface thereof, and having multiple lands for external connection formed on another surface thereof, the multiple lands for external connection being electrically connected to an outside, the one surface of the first wiring board having provided thereon: a first land and a second land for solder joining; a first wiring for electrically connecting the first signal terminal and the first land; and a second wiring for electrically connecting the second signal terminal and the second land; a second semiconductor package stacked on the first semiconductor package, the second semiconductor package including: a second semiconductor element; and a second wiring board having the second semiconductor element mounted on one surface thereof, and having a third land for connection and a fourth land for connection formed on another surface thereof, the third land for connection and the fourth land for connection being electrically connected to the first land for connection and the second land for connection provided on the first wiring board, respectively; and a solder joint portion for electrically connecting together the first land for connection on the first wiring board and the third land for connection on the second wiring board, and electrically connecting together the second land for connection on the first wiring board and the fourth land for connection on the second wiring board, in which a length of the second wiring is larger than a length of the first wiring, and a surface area of the second land is larger than a surface area of the first land.

According to the present invention, a parasitic capacitance generated at the second land is larger than a parasitic capacitance generated at the first land, and thus, difference in transmission line characteristics due to difference in wiring length can be reduced to ensure synchronization of signals transmitted through the wirings.

Further features of the present invention will become apparent from the following description of exemplary embodiments with reference to the attached drawings.

DESCRIPTION OF THE EMBODIMENTS

Embodiments of the present invention are described in detail in the following with reference to the attached drawings.

(First Embodiment)

Figure 1:
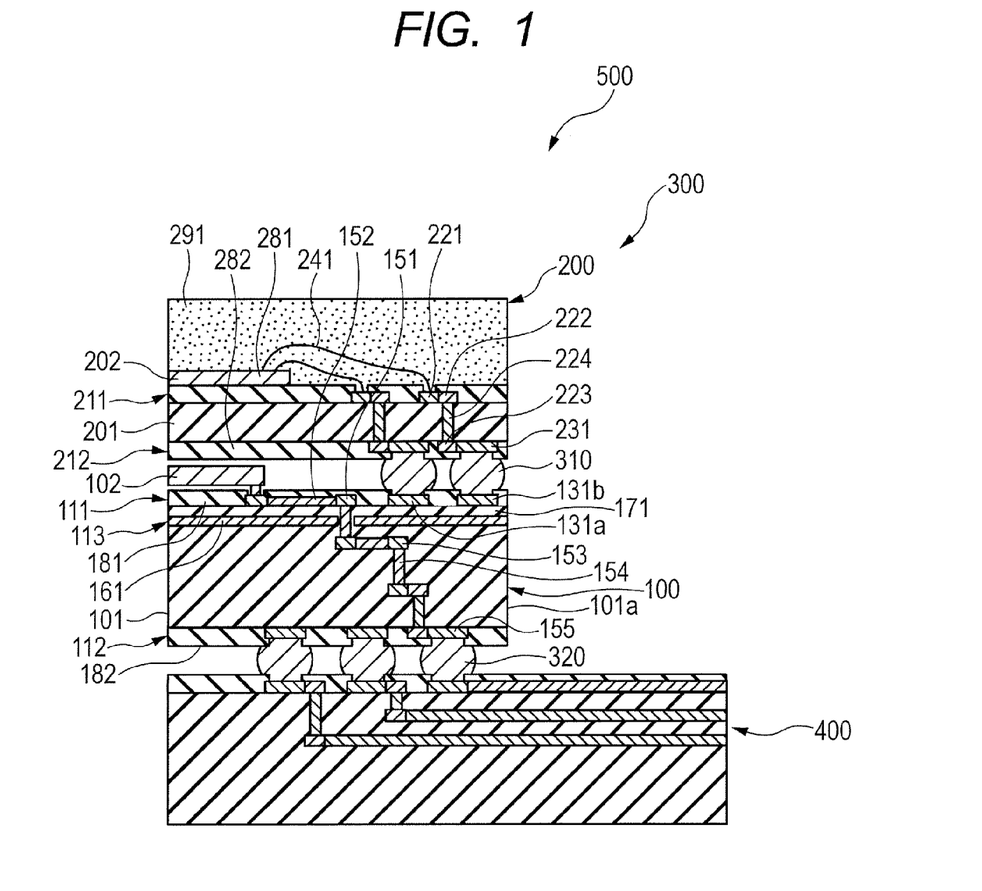
FIG. 1 is a sectional view of a printed circuit board according to a first embodiment of the present invention.

FIG. 1 is a sectional view illustrating a schematic structure of a printed circuit board including a stacked semiconductor package according to a first embodiment of the present invention. A printed circuit board 500 includes a stacked semiconductor package 300 and a motherboard 400 having the stacked semiconductor package 300 mounted thereon. The stacked semiconductor package 300 and the motherboard 400 are joined together by multiple lower solder balls 320.

The stacked semiconductor package 300 is a stacked semiconductor package having a PoP structure. The stacked semiconductor package 300 includes a lower semiconductor package 100 as a first semiconductor package and an upper semiconductor package 200 as a second semiconductor package that is stacked on the lower semiconductor package 100. The lower semiconductor package 100 and the upper semiconductor package 200 are joined together by multiple upper solder balls 310.

The lower semiconductor package 100 includes a lower interposer 101 as a first printed wiring board and a lower semiconductor chip 102 as a first semiconductor element that is mounted on the lower interposer 101. The lower interposer 101 is formed into the shape of a rectangle (for example, into the shape of a square) as seen from a direction perpendicular to the plane of the lower interposer 101. The lower semiconductor chip 102 is also formed into the shape of a rectangle (for example, into the shape of a square) as seen from a direction perpendicular to the plane of the lower semiconductor chip 102.

The upper semiconductor package 200 includes an upper interposer 201 as a second printed wiring board and an upper semiconductor chip 202 as a second semiconductor element that is mounted on the upper interposer 201. The upper interposer 201 is formed into the shape of a rectangle (for example, into the shape of a square) as seen from a direction perpendicular to the plane of the upper interposer 201. The upper semiconductor chip 202 is also formed into the shape of a rectangle (for example, into the shape of a square) as seen from a direction perpendicular to the plane of the upper semiconductor chip 202.

The lower semiconductor chip 102 is, for example, an LSI, and the upper semiconductor chip 202 is, for example, a DDR memory. The lower interposer 101, the solder balls 310 as an upper solder joint portion, and the upper interposer 201 form transmission lines used for communication between the lower semiconductor chip 102 and the upper semiconductor chip 202.

Specific description is made in the following. First, two surface layers 111 and 112 of the lower interposer 101 are wiring layers having multiple wirings formed thereon. The lower semiconductor chip 102 is mounted on the surface layer 111 of the two surface layers 111 and 112 of the lower interposer 101.

Figure 2:
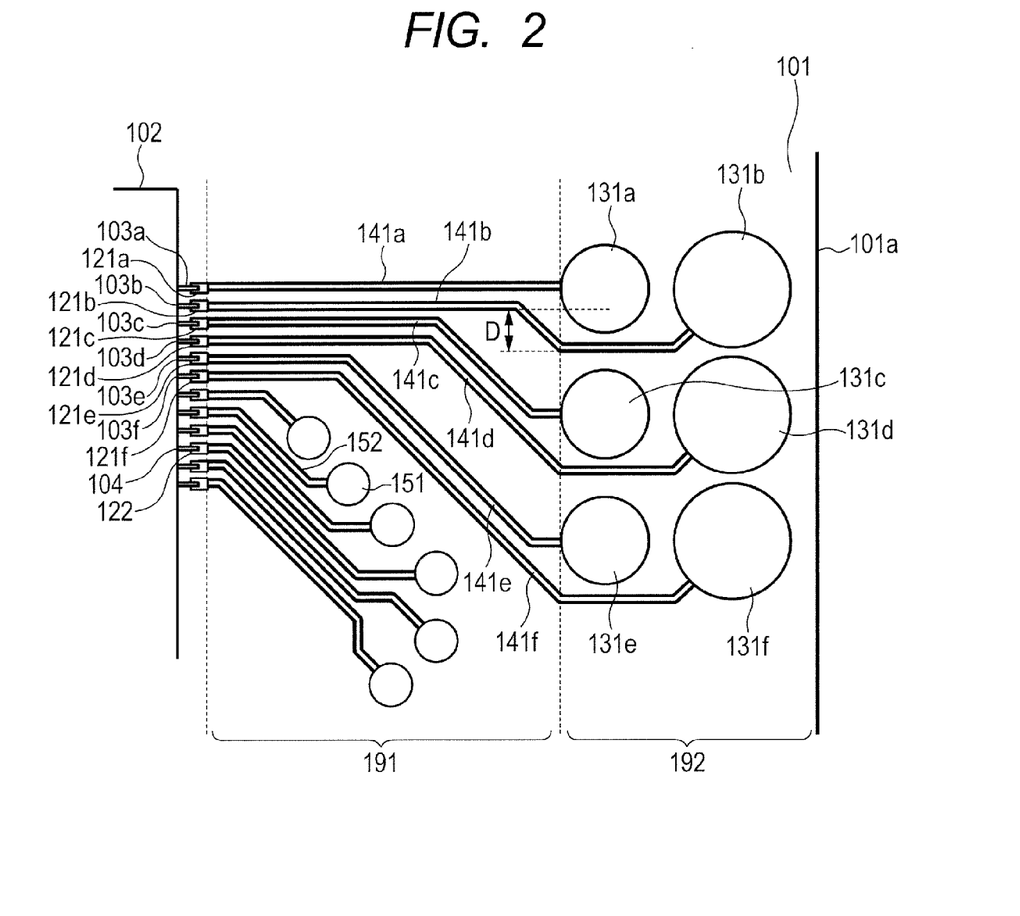
FIG. 2 is a plan view illustrating a surface layer of a lower interposer according to the first embodiment of the present invention.

FIG. 2 is a plan view illustrating the surface layer 111 of the lower interposer 101. As illustrated in FIG. 2, the lower semiconductor chip 102 has multiple signal terminals 103a to 103f and 104. The lower interposer 101 has lands 121a to 121f and 122 for multiple semiconductor chips, which are formed on the surface layer 111, and are solder joined to the signal terminals 103a to 103f and 104, respectively.

Among the multiple signal terminals, the signal terminals 103a to 103f are for communication with the upper semiconductor chip 202 of the upper semiconductor package 200, while the signal terminals 104 are for communication with a semiconductor element (not shown) mounted on the motherboard 400 illustrated in FIG. 1.

Further, the lower interposer 101 has multiple lands 131a to 131f for solder joining, which are formed on the surface layer 111. The lower interposer 101 further has multiple wirings 141a to 141f (wiring pattern) that are formed on the surface layer 111 and electrically connect the lands 121a to 121f for a semiconductor chip and the lands 131a to 131f, respectively. Specifically, the wirings 141a to 141f are electrically connected to the signal terminals 103a to 103f through the lands 121a to 121f for a semiconductor chip, respectively. In the first embodiment of the present invention, the lands 121a to 121f for a semiconductor chip, the lands 131a to 131f, and the wirings 141a to 141f are formed of the same conductive material and are patterned by etching.

Further, the lower interposer 101 has multiple via lands 151 that are formed on the surface layer 111, and multiple wirings 152 (wiring pattern) that electrically connect the lands 122 for a semiconductor chip and the via lands 151, respectively. Specifically, the wirings 152 are electrically connected to the signal terminals 104 through the lands 122 for a semiconductor chip, respectively.

As illustrated in FIG. 1, the lower interposer 101 includes, in an inner layer thereof, a ground pattern 161, multiple via lands 153, and via holes 154 that electrically connect the via lands 153. The ground pattern 161 is formed in a wiring layer 113 that is adjacent to the surface layer 111 through an insulator 171 (for example, an epoxy resin) that forms an insulating layer, and is arranged so as to be opposed to the lands 131a to 131f. Further, the lower interposer 101 has multiple external connection lands 155 for solder joining, which are formed on the surface layer 112, and are electrically connected to the via lands 151 on the surface layer 111 through the via lands 153 and the via holes 154 in the inner layer, respectively.

The lower interposer 101 has solder resists 181 and 182 that are formed on the surface layers 111 and 112, respectively, and cover the wirings 141a to 141f and 152 and the lands 131a to 131f, 151, and 155 on the surface layers 111 and 112. The lands 131a to 131f and 155 on the surface layers 111 and 112, respectively, have exposed areas that are controlled by openings provided in the solder resists 181 and 182, respectively. The solder balls 310 and 320 are connected to the lands 131a to 131f and 155, respectively, through the openings.

Two surface layers 211 and 212 of the upper interposer 201 are wiring layers having multiple wirings formed therein. The upper semiconductor chip 202 is mounted on the surface layer 211 of the two surface layers 211 and 212 of the upper interposer 201.

The upper interposer 201 has multiple wire lands 221 and via lands 222 that are formed in the surface layer 211, and the via lands 222 are electrically connected to the wire lands 221, respectively. Further, the upper interposer 201 has multiple lands 231 for solder joining and via lands 223 that are formed in the surface layer 212, and the via lands 223 are electrically connected to the lands 231, respectively. The via lands 222 in the surface layer 211 and the via lands 223 in the surface layer 212 are electrically connected through via holes 224, respectively.

The upper semiconductor chip 202 and the wire lands 221 are electrically connected through wires 241. The upper semiconductor chip 202 and the wires 241 are encapsulated in an encapsulating resin 291.

The upper interposer 201 has solder resists 281 and 282 that are formed on the surface layers 211 and 212, respectively, and cover the wirings in the surface layers 211 and 212. The lands 231 in the surface layer 212 have exposed areas that are controlled by openings provided in the solder resist 282, and the solder balls 310 as the upper solder joint portion are connected to the lands 231, respectively, through the openings. Specifically, the lands 131 of the lower interposer 101 and the lands 231 of the upper interposer 201 are opposed to each other and are solder joined to each other by the upper solder balls 310 as the solder joint portion.

In the way described above, the lands 121 for a semiconductor chip, the wirings 141, the lands 131, the upper solder balls 310, the lands 231, the via lands 222 and 223, the via holes 224, the wire lands 221, and the wires 241 form the transmission lines that connect the semiconductor chips 102 and 202.

Among the multiple signal terminals 103a to 103f of the lower semiconductor chip 102, the signal terminals 103a to 103d are terminals that output data signals, and the signal terminals 103e and 103f are terminals that output strobe signals having opposite phases. Therefore, the wirings 141a to 141d are bus wirings used for transmitting data signals, and the wirings 141e and 141f are differential signal wirings used for transmitting strobe signals. The widths of the wirings 141a to 141f are the same, and are, for example, 25 µm. Further, clearance, which is equal to or larger than the width of the wirings 141a to 141f, is provided around the wirings 141a to 141f so that a short-circuit is not caused between the wirings 141a to 141f or between the wirings 141a to 141f and the lands 131a to 131f.

The lands 131a to 131f are in peripheral arrangement in which the lands 131a to 131f are arranged in a lattice-like manner in a land region 192 located outside a wiring region 191. The surfaces of the lands 131a to 131f are formed in the shape of a circle. The land region 192 is a region between an end 101a of the interposer 101 and ends of the lands on the semiconductor chip 102 side. The lands 131a to 131f are arranged in a lattice-like manner with equal pitches in the land region 192. The pitches are, for example, 0.4 mm. These lands 131a to 131f are divided into lands arranged on the inside (on the semiconductor chip side) (first lands) 131a, 131c, and 131e and lands arranged on the outside (on the interposer end side) (second lands) 131b, 131d, and 131f.

The wiring region 191 is a region between the ends of the lands on the semiconductor chip 102 side and the lands 121 for a semiconductor chip. The bus wirings 141a to 141d and the differential signal wirings 141e and 141f are arranged in the wiring region 191. Further, the via lands 151 used for connection with the motherboard 400 are arranged in the wiring region 191.

The bus wirings 141b and 141d (second wirings) are respectively connected to, among the lands, the lands 131b and 131d (second lands) arranged on the end 101a side of the interposer 101. Therefore, the lengths of the bus wirings 141b and 141d are larger by at least the pitch than the lengths of the bus wirings 141a and 141c (first wirings) that are respectively connected to, among the lands, the lands 131a and 131c (first lands) arranged on the semiconductor chip 102 side. Similarly, the differential signal wiring 141f (second wiring) is connected to, among the lands, the land 131f (second land) arranged on the end 101a side of the interposer 101. Therefore, the length of the differential signal wiring 141f is larger by at least the pitch than the length of the differential signal wiring 141e (first wiring) that is connected to, among the lands, the land 131e (first land) arranged on the semiconductor chip 102 side.

In the first embodiment of the present invention, each of the surface areas of the lands 131b, 131d, and 131f is larger than each of the surface areas of the lands 131a, 131c, and 131e. Specifically, the diameter of the lands 131b, 131d, and 131f is larger than the diameter of the lands 131a, 131c, and 131e.

In this case, the wiring 141a (141c, 141e) and the land 131a (131c, 131e) form a first transmission line. Further, the wiring 141b (141d, 141f) and the land 131b (131d, 131f) form a second transmission line.

Figure 3:
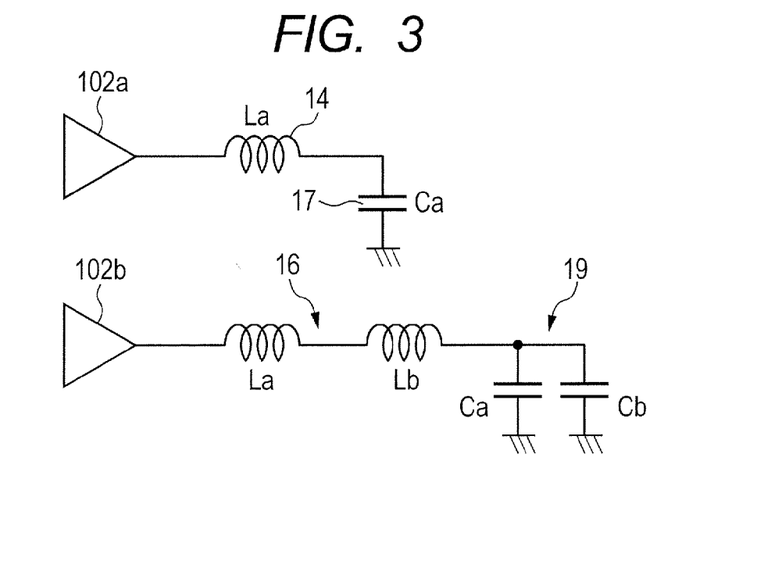
FIG. 3 is an equivalent circuit diagram of a first transmission line and a second transmission line according to the first embodiment of the present invention.

FIG. 3 is an equivalent circuit diagram of the first and second transmission lines according to the first embodiment of the present invention. As illustrated in FIG. 3, the semiconductor chip 102 includes transmitting circuits 102a and 102b as bus circuits. The transmitting circuit 102a outputs a data signal from the signal terminal 103a as a first signal terminal. The transmitting circuit 102b outputs a data signal from the signal terminal 103b as a second signal terminal.

The wirings are structured to have a fine line shape. For example, while the width is 25 µm and the thickness is 25 µm, the length is several millimeters. In this wiring structure, the inductance is proportional to the length.

The value of a parasitic inductance 14 of the wiring 141a as the first wiring is represented by La. The length of the wiring 141b as the second wiring is larger than that of the wiring 141a, and thus, the inductance of the wiring 141b is higher by the parasitic inductance corresponding to the difference in wiring length. The value of the parasitic inductance corresponding to the difference is represented by Lb. Then, the value of a parasitic inductance 16 of the wiring 141b is represented by La+Lb.

Further, the lands 131a to 131f form a parallel plate structure with the ground pattern 161 arranged on an adjacent layer at positions opposed thereto. This structure behaves as a parasitic capacitance, and the value thereof is proportional to the surface areas of the lands 131a to 131f.

The value of a parasitic capacitance 17 of the land 131a as the first land is represented by Ca. The surface area of the land 131b as the second land is larger than that of the land 131a, and thus, the capacitance of the land 131b is higher by the parasitic capacitance corresponding to the difference in area. The value of the parasitic capacitance corresponding to the difference is represented by Cb. Then, the value of a parasitic capacitance 19 of the land 131b is represented by Ca+Cb.

A characteristic impedance Z1 of the first transmission line and a characteristic impedance Z2 of the second transmission line are dependent on these parasitic inductances and parasitic capacitances. Specifically, Z1 and Z2 are expressed by the following expressions (1) and (2):

$$Z_1 = \sqrt{\frac{L_a}{C_a}} \ [\Omega] \tag{1}$$

$$Z_2 = \sqrt{\frac{L_a + L_b}{C_a + C_b}} \ [\Omega] \tag{2}$$

The difference in characteristics between the transmission lines is expressed by the following expression (3):

$$\frac{|Z_1 - Z_2|}{Z_2} [\%] \tag{3}$$

In the first embodiment of the present invention, in accordance with the difference Lb in parasitic inductance due to the difference in wiring length between the wirings 141a and 141b, a difference is made between the sizes of the lands 131a and 131b to adjust the difference Cb so that the difference in characteristics between the transmission lines expressed by the expression (3) becomes smaller. This reduces the difference in characteristics between the transmission lines to enable synchronization of signals transmitted through the transmission lines. Therefore, a stacked semiconductor package excellent in high speed transmission characteristics can be realized.

Conventionally, a difference is not made between the sizes of the lands 131a and 131b, which corresponds to a case in which the difference Cb is zero. It can be seen that, by setting the difference Cb so that the following expression (4) is satisfied, the difference in transmission line characteristics can be reduced compared with the conventional case:

$$\left| \sqrt{\frac{L_a}{C_a}} - \sqrt{\frac{L_a + L_b}{C_a}} \right| > \left| \sqrt{\frac{L_a}{C_a}} - \sqrt{\frac{L_a + L_b}{C_a + C_b}} \right| \quad (4)$$

In the above description, the relationship between the land 131a and the land 131b is described. Similarly, the difference Cb is set with regard to the relationship between the land 131b and the land 131c and with regard to the relationship between the land 131c and the land 131d. Therefore, in the first embodiment of the present invention, synchronization of data signals can be ensured with regard to all the bus wirings.

Further, in the above description, the wirings 141a to 141d connected to the bus circuits of the semiconductor chip 102 are described. Similarly, the difference Lb is caused in accordance with the wiring lengths with regard to the wirings 141e and 141f connected to a differential circuit of the semiconductor chip 102. Therefore, also in this case, by making a difference between the sizes of the lands 131e and 131f, the difference Cb may be adjusted so that the difference in transmission line characteristics expressed by the expression (3) is reduced. In this way, synchronization can be ensured with regard to strobe signals transmitted through the differential signal wirings.

Suppose the areas of the lands 131a to 131f are the same. By narrowing the pitches of the lands, the space among the lands 131a to 131f can be reduced to reduce the area of the land region 192. However, the space between the first lands 131a and 131c (131c and 131e) is reduced, and thus, space for placing the second wiring 141b (141d) is lost. Therefore, it is necessary to increase the number of layers of the interposer 101 of the lower semiconductor package and to arrange, in a layer other than the surface layer, wirings for connecting the second lands 131b and 131d and the lands 121b and 121d for a semiconductor chip, respectively. This becomes a factor in preventing the stacked semiconductor package from being thinned.

On the other hand, according to the first embodiment of the present invention, the surface areas of the first lands 131a, 131c, and 131e are relatively smaller than those of the second lands 131b, 131d, and 131f. Therefore, even when the pitches are narrowed, the space between the lands 131a and 131c (131c and 131e) is ensured. Therefore, both downsizing and thinning of the semiconductor package 100 can be achieved at the same time, and, by extension, both downsizing and thinning of the stacked semiconductor package 300 can be achieved at the same time.

Further, as described above, it is necessary to arrange in the wiring region 191, in addition to the transmission lines, the via lands 151 used for connection with the motherboard 400. In recent years, as the system is more sophisticated in functionality, the number of vias for connection with the motherboard increases. In this case, the space that can be used for placing the transmission lines in the wiring region 191 is reduced.

The size of the space for placing the transmission lines is partly determined by space necessary for routing around the lands 131a, 131c, and 131e. As described above, the second wirings 141b, 141d, and 141f connect the lands 121b, 121d, and 141f for a semiconductor chip and the second lands 131b, 131d, and 131f, respectively. The pitches of the lands 121a to 121f for a semiconductor chip are about one tenth of the pitches of the lands 131a to 131f. Therefore, the second wirings 141b, 141d, and 141f are arranged so as to route around the first lands 131a, 131c, and 131e, respectively.

According to the first embodiment of the present invention, the first lands 131a, 131c, and 131e are smaller than the second lands 131b, 131d, and 131f, and thus, the space necessary for routing around the first lands can be reduced. This enables further downsizing of the semiconductor package 100, and, by extension, further downsizing of the stacked semiconductor package 300.

(Second Embodiment)

Figure 4:
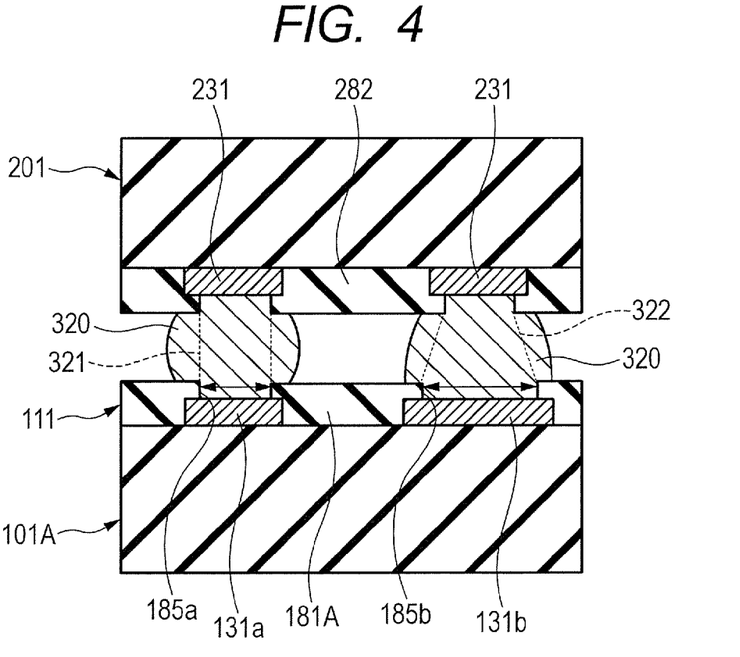
FIG. 4 is a sectional view of a principal part of a stacked semiconductor package according to a second embodiment of the present invention.

Next, a stacked semiconductor package according to a second embodiment of the present invention is described. FIG. 4 is a sectional view of a principal part of the stacked semiconductor package according to the second embodiment of the present invention. FIG. 4 is an enlarged view of a region in which the upper semiconductor package and the lower semiconductor package are connected together. Note that, in the second embodiment of the present invention, like reference symbols are used to designate like members in the first embodiment of the present invention, and description thereof is omitted.

A lower interposer 101A as a first printed wiring board has a solder resist 181A formed on the surface layer 111. The solder resist 181A has formed therein an opening 185a as a first opening for exposing the surface of the land 131a as the first land, and an opening 185b as a second opening for exposing the surface of the land 131b as the second land. The solder balls 320 are connected to the lands 131a and 131b through the openings 185a and 185b, respectively.

In the second embodiment of the present invention, in addition to the larger surface area of the land 131b as the second land than that of the land 131a as the first land, the opening 185b as the second opening is formed so as to have a larger opening area than that of the opening 185a as the first opening. The rest of the structure is the same as that of the first embodiment of the present invention.

In the first embodiment of the present invention described above, measures for reducing the difference in transmission line characteristics in the lower semiconductor package 100 is described. Other components of the transmission lines in communication between the upper semiconductor chip and the lower semiconductor chip include the solder balls 320. The solder balls 320 have an effect on the waveforms of the signals as parasitic inductances.

The parasitic inductances of the solder balls 320 are determined by the heights and the diameters of the solder balls 320. Among the heights and the diameters, the diameters depend on the contact areas between the solder balls 320 and the lands 131a and 131b, and thus, in the second embodiment of the present invention, the diameters are controlled by the diameters of the openings. Further, the heights depend on the thermal deformation of the upper and the lower semiconductor packages, and thus, the heights vary depending on the places at which the solder balls 320 are arranged. In a stacked semiconductor package, terminals of the upper and lower semiconductor packages are arranged only on the periphery of the packages, and thus, the heights of the terminals are substantially the same.

The precise shapes of the solder balls 320 are determined taking into consideration the conditions of a mounting step and the like, and thus, it is difficult to determine the precise shapes at the time of designing the stacked semiconductor package. Therefore, when transmission line characteristics are considered, generally, a circular cylinder or a circular cone frustum with the openings in the upper and lower semiconductor packages being top and bottom surfaces thereof, respectively, is assumed to be an effective shape, and the parasitic inductance thereof is considered.

In the second embodiment of the present invention, the diameter of the effective shape (second effective shape) 322 of the solder ball 320 connected to the second transmission line is larger than the diameter of the effective shape (first effective shape) 321 of the solder ball 320 connected to the first transmission line. Therefore, the parasitic inductance of the second effective shape 322 is lower than that of the first effective shape 321. The difference in transmission line characteristics due to the difference in wiring length is absorbed by the difference in characteristics of the solder balls 320, and thus, the difference in transmission line characteristics can be further reduced. Therefore, according to the second embodiment of the present invention, further improvement in high speed transmission characteristics can be realized.

EXAMPLE

In this example, a simulation was performed with regard to the structure of the stacked semiconductor package 300 of the above-mentioned first embodiment of the present invention with the components having the following dimensions.

The length of the wiring 141*a* as the first wiring was 0.5 mm, and the length of the wiring 141*b* as the second wiring was 0.9 mm. The width of the wirings 141*a* and 141*b* was 25 μm, and the clearance provided around the wirings was 25 μm. The thickness of the wirings 141*a* and 141*b* was 25 μm. The distance between the surface layer and a layer adjacent to the surface layer was 40 μm.

The diameter of the land 131*b* as the second land was 330 μm. On the other hand, the diameter of the first land 131*a* was 320 μm, 300 μm, and 280 μm. The pitch between the lands 131*a* and 131*b* was 0.4 mm. The frequency of signals to be transmitted was 400 MHz. The allowable difference in transmission line characteristics becomes smaller in accordance with the frequency, and, when the frequency is 400 MHz, the allowable difference in transmission line characteristics is 30% or less.

Figure 5:
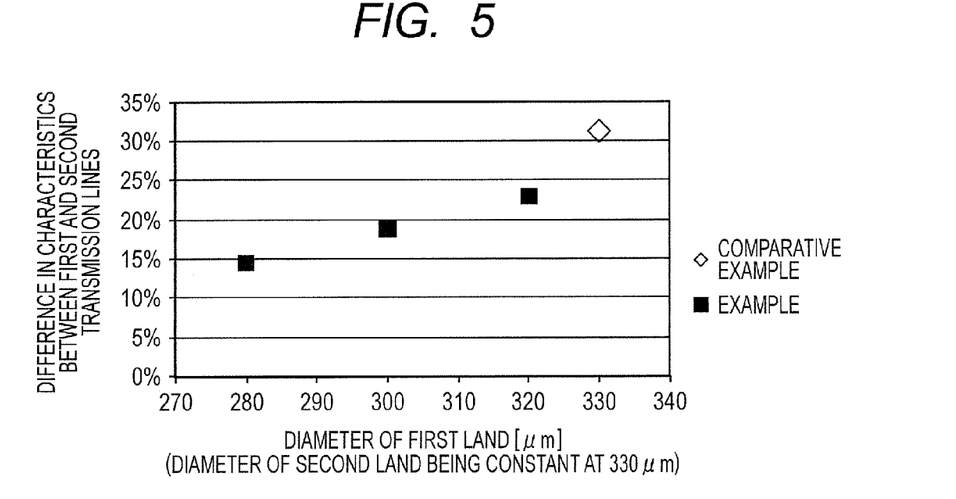
FIG. 5 is a graph showing difference in characteristics between the first transmission line and the second transmission line.

FIG. 5 is a graph showing the result of the simulation of the difference in characteristics between the first transmission line and the second transmission line. The simulation was performed using Q3D Extractor (manufactured by Ansoft Corporation) that is a commercially available simulator.

The parasitic inductance of the wiring 141*a* as the first wiring was 0.33 nH, and the parasitic inductance of the wiring 141*b* as the second wiring was 0.69 nH. The parasitic capacitance of the land 131*b* as the second land was 0.038 pF. The parasitic capacitance of the land 131*a* as the first land was 0.030 pF (when the diameter was 320 μm), 0.027 pF (when the diameter was 300 μm), and 0.025 pF (when the diameter was 280 μm).

Under these conditions, the characteristic impedance of the second transmission line was 135Ω. The characteristic impedance of the first transmission line was 104Ω (when the diameter was 320 μm), 109Ω (when the diameter was 300 μm), and 115Ω (when the diameter was 280 μm).

From the above, the difference between the first transmission line characteristics and the second transmission line characteristics was 22.9% (when the diameter was 320 μm), 18.9% (when the diameter was 300 μm), and 14.5% (when the diameter was 280 μm). The differences in all cases were 30% or less, and thus, were allowable.

The length D (see FIG. 2) of the part of the wiring 141*b* routing around the land 131*a* was 97.5 μm (when the diameter of the first land was 320 μm), 87.5 μm (when the diameter was 300 μm), and 77.5 μm (when the diameter was 280 μm).

COMPARATIVE EXAMPLE

Figure 6:
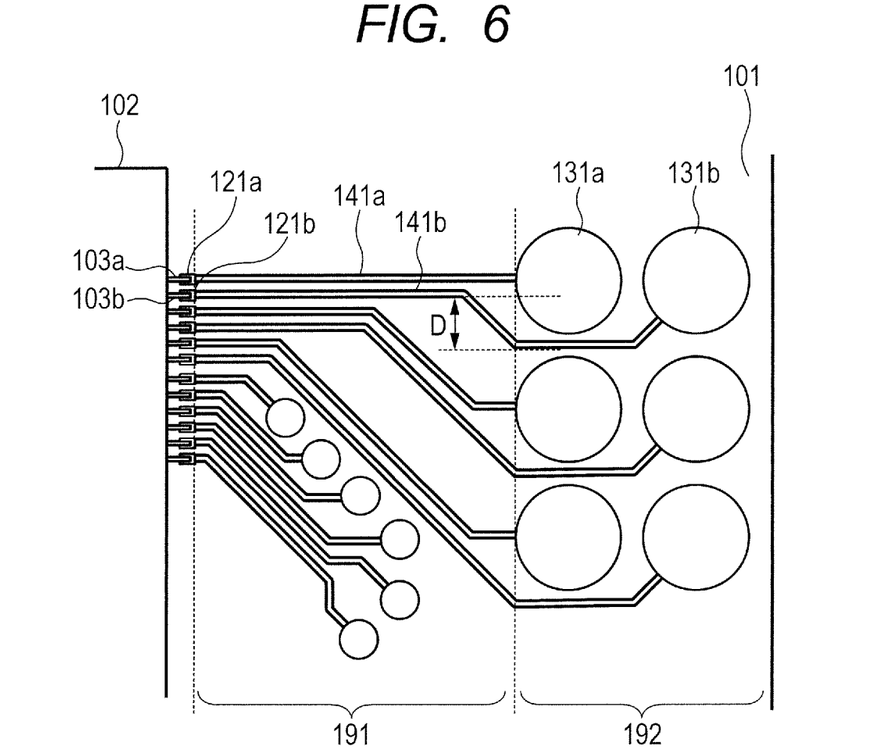
FIG. 6 is a plan view illustrating a surface layer of a lower interposer in Comparative Example.

For comparison, a simulation of the difference in characteristics between the first transmission line and the second transmission line was also performed with regard to a semiconductor package illustrated in FIG. 6. The lands 131*a* and 131*b* in Comparative Example had the same diameter. The diameter of the first land 131*a* and the second land 131*b* was 330 μm, and the rest of the dimensions were the same as those in the example. FIG. 5 also shows the result of this simulation. The difference in transmission line characteristics was 31.2%, which was more than the allowable difference. Further, the length of the part of the wiring routing around the land in Comparative Example was 102.5 μm (when the diameter was 330 μm).

From the result of the comparison between this example and Comparative Example described above, it was found that this example was able to reduce the influence of the difference in wiring length. Further, in this example, the length of the part of the wiring 141*b* routing around the land 131*a* was reduced by 24% at the maximum (when the diameter was 280 μm) compared with that in Comparative Example. Therefore, it is found that this example can reduce the space necessary for placing the transmission lines in the wiring region 191 to realize the downsizing of the stacked semiconductor package.

Note that, the present invention is not limited to the embodiments and the example described above, and various modifications can be made by those with an ordinary skill in the art within the technical idea of the present invention.

In the above description, cases in which the surfaces of the lands 131*a* to 131*f* are in the shape of a circle are described, but the present invention is not limited thereto, and the surfaces of the lands may be in any shape including the shape of a square.

Further, in the above description, the solder balls (lands) are in two lines, but the solder balls (lands) may be in three or more lines.

Further, in the above description, cases in which the solder connected to the lands is solder balls are described, but the solder may be, other than the solder balls, connection terminals formed by applying solder to rigid balls.

Further, the semiconductor chips and the interposers are in the shape of a square, and thus, a wiring close to a corner tends to be longer than a wiring close to a midpoint of an edge of an interposer. In such a case, a land close to a corner is formed so as to be larger than a land close to a midpoint of an edge. In this way, the difference in transmission line characteristics due to the difference in wiring length can be reduced.

Further, in the above description, the lower semiconductor package is described, but it is apparent that, by applying a similar structure to the upper semiconductor package, the difference in transmission line characteristics can be further reduced. Further, the present invention is also applicable to the lands in the lower semiconductor package that are joined by solder to the motherboard.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-122975, filed May 30, 2012, which is hereby incorporated by reference herein in its entirety.

What is claimed is:

1. A stacked semiconductor package, comprising:
    a first semiconductor package including:
        a first semiconductor element having a first signal terminal and a second signal terminal; and
        a first wiring board having the first semiconductor element mounted on one surface thereof, and having multiple lands for external connection formed on another surface thereof, the multiple lands for external connection being electrically connected to an outside,
        the one surface of the first wiring board having provided thereon:
            a first land and a second land for solder joining;
            a first wiring for electrically connecting the first signal terminal and the first land; and
            a second wiring for electrically connecting the second signal terminal and the second land;
    a second semiconductor package stacked on the first semiconductor package, the second semiconductor package including:
        a second semiconductor element; and
        a second wiring board having the second semiconductor element mounted on one surface thereof, and having a third land for connection and a fourth land for connection formed on another surface thereof, the third land for connection and the fourth land for connection being electrically connected to the first land for connection and the second land for connection provided on the first wiring board, respectively; and
    a solder joint portion for electrically connecting together the first land for connection on the first wiring board and the third land for connection on the second wiring board, and electrically connecting together the second land for connection on the first wiring board and the fourth land for connection on the second wiring board,
    wherein a length of the second wiring is larger than a length of the first wiring, and a surface area of the second land is larger than a surface area of the first land.

2. The stacked semiconductor package according to claim 1, wherein:
    the one surface of the first wiring board is covered with a solder resist;
    the solder resist has a first opening for exposing a surface of the first land and a second opening for exposing a surface of the second land formed therein;
    the surface area of the first land corresponds to a surface area of a part of the first land exposed in the first opening; and
    the surface area of the second land corresponds to a surface area of a part of the second land exposed in the second opening.

3. The stacked semiconductor package according to claim 1, wherein an area of the second land for connection is larger than an area of the first land for connection.

4. The stacked semiconductor package according to claim 1, wherein the first signal terminal and the second signal terminal comprise terminals for outputting data signals, and the first wiring and the second wiring comprise bus wirings used for transmitting data signals.

5. The stacked semiconductor package according to claim 1, wherein the first signal terminal and the second signal terminal comprise terminals for outputting strobe signals, and the first wiring and the second wiring comprise wirings used for transmitting strobe signals.

6. The stacked semiconductor package according to claim 1, wherein the following expression is satisfied:

$$\left| \sqrt{\frac{L_a}{C_a}} - \sqrt{\frac{L_a + L_b}{C_a}} \right| > \left| \sqrt{\frac{L_a}{C_a}} - \sqrt{\frac{L_a + L_b}{C_a + C_b}} \right|$$

where La represents an inductance of the first wiring, Ca represents a capacitance of the first land, La+Lb represents an inductance of the second wiring, and Ca+Cb represents a capacitance of the second land.

7. A printed circuit board, comprising the stacked semiconductor package according to claim 1 mounted thereon.

8. A printed wiring board, comprising on one surface thereof:
    a first land for a semiconductor chip and a second land for a semiconductor chip for mounting thereon a semiconductor element;
    a first land and a second land for solder joining;
    a first wiring for electrically connecting a first signal terminal of the semiconductor element and the first land; and
    a second wiring for electrically connecting a second signal terminal of the semiconductor element and the second land,
    wherein a length of the second wiring is larger than a length of the first wiring, and a surface area of the second land is larger than a surface area of the first land.

9. The printed wiring board according to claim 8, wherein:
    the one surface of the printed wiring board is covered with a solder resist;
    the solder resist has a first opening for exposing a surface of the first land and a second opening for exposing a surface of the second land formed therein;
    the surface area of the first land corresponds to a surface area of a part of the first land exposed in the first opening; and
    the surface area of the second land corresponds to a surface area of a part of the second land exposed in the second opening.

10. The printed wiring board according to claim 8, wherein the first signal terminal and the second signal terminal comprise terminals for outputting data signals, and the first wiring and the second wiring comprise bus wirings used for transmitting data signals.

11. The printed wiring board according to claim 8, wherein the first signal terminal and the second signal terminal comprise terminals for outputting strobe signals, and the first wiring and the second wiring comprise wirings used for transmitting strobe signals.

12. The printed wiring board according to claim 8, wherein the following expression is satisfied:

$$\left| \sqrt{\frac{L_a}{C_a}} - \sqrt{\frac{L_a + L_b}{C_a}} \right| > \left| \sqrt{\frac{L_a}{C_a}} - \sqrt{\frac{L_a + L_b}{C_a + C_b}} \right|$$

where La represents an inductance of the first wiring, Ca represents a capacitance of the first land, La+Lb represents an inductance of the second wiring, and Ca+Cb represents a capacitance of the second land.

13. A printed circuit board, comprising:
a semiconductor element having a first signal terminal and a second signal terminal; and
a printed wiring board having the semiconductor element mounted on one surface thereof, the one surface of the printed wiring board having formed thereon:
   a first land and a second land for solder joining;
   a first wiring for electrically connecting the first signal terminal and the first land; and
   a second wiring for electrically connecting the second signal terminal and the second land,
wherein a length of the second wiring is larger than a length of the first wiring, and a surface area of the second land is larger than a surface area of the first land.

14. The printed circuit board according to claim 13, wherein:
the one surface of the printed wiring board is covered with a solder resist;
the solder resist has a first opening for exposing a surface of the first land and a second opening for exposing a surface of the second land formed therein;
the surface area of the first land corresponds to a surface area of a part of the first land exposed in the first opening; and
the surface area of the second land corresponds to a surface area of a part of the second land exposed in the second opening.

15. The printed circuit board according to claim 13, wherein the first signal terminal and the second signal terminal comprise terminals for outputting data signals, and the first wiring and the second wiring comprise bus wirings used for transmitting data signals.

16. The printed circuit board according to claim 13, wherein the first signal terminal and the second signal terminal comprise terminals for outputting strobe signals, and the first wiring and the second wiring comprise wirings used for transmitting strobe signals.

17. The printed circuit board according to claim 13, wherein the following expression is satisfied:

$$\left| \sqrt{\frac{L_a}{C_a}} - \sqrt{\frac{L_a + L_b}{C_a}} \right| > \left| \sqrt{\frac{L_a}{C_a}} - \sqrt{\frac{L_a + L_b}{C_a + C_b}} \right|$$

where La represents an inductance of the first wiring, Ca represents a capacitance of the first land, La+Lb represents an inductance of the second wiring, and Ca+Cb represents a capacitance of the second land.

* * * * *